US005615220A

United States Patent [19]
Pharris

[11] Patent Number: 5,615,220
[45] Date of Patent: Mar. 25, 1997

[54] POLYNOMIAL DIVIDER WHICH CAN PERFORM EUCLID'S ALGORITHM TO PRODUCE AN ERROR LOCATOR POLYNOMIAL FROM AN ERROR SYNDROME POLYNOMIAL, AND APPARATUS INCLUDING THE POLYNOMIAL DIVIDER

[75] Inventor: Kenton J. Pharris, Elbert, Colo.

[73] Assignee: Philips Electronics North America Corporation, New York, N.Y.

[21] Appl. No.: 381,626

[22] Filed: Jan. 31, 1995

[51] Int. Cl.$^6$ .................................................. H03M 13/00
[52] U.S. Cl. ......................................................... 371/37.1
[58] Field of Search ................................. 364/746.1, 761; 371/37.1, 37.8

[56] References Cited

U.S. PATENT DOCUMENTS

| | | | |
|---|---|---|---|
| 5,185,711 | 2/1993 | Hattori | 364/746.1 |
| 5,309,449 | 5/1994 | Gandini | 371/37.1 |
| 5,365,529 | 11/1994 | Mester | 371/37.1 |
| 5,367,478 | 11/1994 | Hattori | 364/746.1 |
| 5,367,479 | 11/1994 | Van Der Putten | 364/761 |
| 5,379,243 | 1/1995 | Greenberger et al. | 364/746.1 |
| 5,436,916 | 7/1995 | Nakamura | 371/37.1 |
| 5,442,578 | 8/1995 | Hattori | 364/746.1 |
| 5,495,488 | 2/1996 | Nakamura | 371/37.1 |
| 5,504,758 | 4/1996 | Inoue et al. | 371/37.1 |

FOREIGN PATENT DOCUMENTS

0620654A2   10/1994   European Pat. Off. .

OTHER PUBLICATIONS

Clark et al., "Error-Correction Coding For Digital Communications", Chapters 5.3.2–5.4, pp. 191–208, 1988 (3rd printing, Plenum Press).

Peterson et al., "Error-Correcting Codes", Chapter 7, pp. 170–179, 1980, (4th ed., MIT).

Shao et al., "A VLSI Design of a Pipeline Reed–Solomon Decoder", IEEE Transactions on Computers, vol. C–34, No. 5, May 1985, pp. 393–402.

MacWilliams et al., *The Theory of Error–Correcting Codes*, Bell Laboratories, Murray Hill, NJ, pp. 362–364, 1987.

Yongjin Jeong and Wayne Burleson, VLSI Array Synthesis for Polynomial GCD Computation, Application Specific Array Processors, 1993 Int'l Conference. IEEE 0–8186–3492–Aug. 1993.

(List continued on next page.)

*Primary Examiner*—Roy N. Envall, Jr.
*Assistant Examiner*—Yoncha Kundupoglu
*Attorney, Agent, or Firm*—Richard A. Weiss

[57] ABSTRACT

A polynomial divider which can perform Euclid's Algorithm by iteratively solving both equations thereof through performing iterations of polynomial division so as to produce an error locator polynomial from an error syndrome polynomial, and apparatus including the polynomial divider. The polynomial divider is capable of performing polynomial division of a numerator polynomial by a denominator polynomial to produce a quotient polynomial and a remainder polynomial. The polynomial divider includes (a) a first set of registers for storing the denominator polynomial; (b) a second set of registers for storing the remainder polynomial; (c) an input for receiving the numerator polynomial; (d) an output for supplying the quotient polynomial; (e) a first coupling unit far coupling the first set of registers to the input so that the denominator polynomial stored in the first set of registers becomes the numerator polynomial which is received by the input and used in a further polynomial division; and (f) a second coupling unit for coupling the second set of registers to the first set of registers so that the remainder polynomial stored in the second set of registers becomes the denominator polynomial which is stored in the first set registers and used in the further polynomial division. An error locator polynomial determining apparatus includes the polynomial divider and a control unit for controlling the polynomial divider. An error correction apparatus includes the error locator polynomial determining apparatus, an error information determiner and a data corrector.

22 Claims, 5 Drawing Sheets

OTHER PUBLICATIONS

Yongjin Jeong and Wayne Burleson, VLSI Array Synthesis for Polynomial GCD Computation and Application to Finite Field Division, IEEE Transactions on Circuits and Systems: –I Fundamental Theory and Applications, vol. 41, No. 12, Dec. 1994.

Richard P. Brent, Systolic VLSI Arrays for Polynomial GCD Computation, IEEE Transactions on Computers, vol. C–33, No. 8, Aug. 1984.

POLYNOMIAL DIVIDER WHICH CAN PERFORM EUCLID'S ALGORITHM TO PRODUCE AN ERROR LOCATOR POLYNOMIAL FROM AN ERROR SYNDROME POLYNOMIAL, AND APPARATUS INCLUDING THE POLYNOMIAL DIVIDER

BACKGROUND OF THE INVENTION

1. Field of the Invention

The invention relates to a polynomial divider which can perform, and apparatus including the polynomial divider which employ, Euclid's Algorithm to produce an error locator polynomial for use in performing error correction. In particular, the invention relates to a polynomial divider which can perform Euclid's Algorithm by iteratively solving both equations thereof to produce an error locator polynomial from an error syndrome polynomial; an error locator polynomial determining apparatus which includes the polynomial divider and a control unit for controlling the polynomial divider; and an error correction apparatus which includes the error locator polynomial determining apparatus.

2. Description of Related Art

Digital information signals made up of information data bytes are often encoded and transmitted through transmission mediums, such as, for example, optical record carriers. Such signals can represent audio, video and/or textual information. For example, those signals can be digital audio signals representing music or digital video signals representing pictures, full motion video or television signals.

When a digital information signal is encoded for transmission through a transmission medium, one or more error detection data bytes and error correction data bytes are typically added to the information data bytes of that digital information signal in a process which produces a coded digital signal (hereinafter referred to as a "coded signal"). A coded signal includes data bytes which include the information data bytes of a digital information signal and the one or more error detection data bytes and error correction data bytes added thereto.

To obtain a replica of a digital information signal from a coded signal (received from a transmission medium), a decoding process including error detection and, if necessary, error correction is used. Error correction becomes necessary when error detection reveals that one or more errors exist in one or more of the data bytes of an encoded signal. Error correction and error detection are processes which are performed in the binary field, i.e., GF(2).

Before erroneous data bytes of an encoded signal can be corrected, an error correction apparatus must first determine (a) where within the encoded signal errors exists and (b) what those errors are. An error correction apparatus makes that determination in two pre-correction steps.

In the first pre-correction step, the error correction apparatus uses an error syndrome polynomial produced by an error detection apparatus for the encoded signal to produce an error locator polynomial for that encoded signal. That step can be performed through means of a number of well known algorithms, including Euclid's Algorithm and Berlekamp's Algorithm. See Clark and Cain, *Error-Correction Encoding for Digital Communications*, chapter 5.4, pgs. 195–208, 1988 (3rd printing, Plenum Press).

Euclid's Algorithm is used to produce an error locator polynomial from an error syndrome polynomial by iteratively solving two equations:

$$Q_i = MA_{i-2}/MA_{i-1} \text{ (quotient only), and} \quad \text{(EQ. 1)}$$

$$MA_i = MA_{i-2} + Q_i MA_{i-1}, \quad \text{(EQ. 2)}$$

for i incremented from 2 to n by 1, where n is the lowest value of i for which the degree of polynomial $Q_i$ is less than T, and T is a constant which specifies the maximum number of errors which can be error corrected. As one skilled in the art is aware, the value of T is dictated by the number of error detection and/or error correction data bytes included in a coded signal. Polynomial $MA_0$ is equal to $X^{2T}$ (a polynomial constant), and polynomial $MA_1$ is the error syndrome polynomial. Polynomial $Q_n$ is the error locator polynomial.

In the second pre-correction step, the error correction apparatus uses the error locator polynomial to obtain specific information about (a) the location where within the encoded signal one or more errors exist and (b) what those one or more errors are (all of that information is hereinafter referred to as "i & e information"). That step can be performed, for example, by means of the well known Chien search method. See Clark and Cain, chapter 5.3, pgs. 193–194. Once the i & e information has been obtained, erroneous data bytes of the encoded signal can be error corrected.

The equipment which is currently available to produce an error locator polynomial from an error syndrome polynomial is inefficient. That equipment is too slow for current needs, and/or it requires more hardware than is necessary.

SUMMARY OF THE INVENTION

The invention solves the above-mentioned problems by means of a polynomial divider which can perform Euclid's Algorithm to produce an error locator polynomial from an error syndrome polynomial. That polynomial divider is able to iteratively solve both equations of Euclid's Algorithm itself to produce the error locator polynomial from the error syndrome polynomial.

A polynomial divider in accordance with the invention comprises a polynomial division unit for performing polynomial division of a numerator polynomial by a denominator polynomial to produce a quotient polynomial and a remainder polynomial. The polynomial division unit includes a first set of registers for storing the denominator polynomial used in a polynomial division, and a second set of registers for storing the remainder polynomial produced by the polynomial division. The polynomial divider further comprises (a) an input for receiving the numerator polynomial used in the polynomial division; (b) an output for supplying the quotient polynomial produced by the polynomial division; (c) a first coupling unit for coupling the first set of registers to the input so that the denominator polynomial stored in the first set of registers becomes the numerator polynomial which is received by the input and used in a further polynomial division performed by the polynomial division unit; and (d) a second coupling unit for coupling the second set of registers to the first set of registers so that the remainder polynomial stored in the second set of registers becomes the denominator polynomial which is stored in the first set of registers and used in the further polynomial division.

An error locator polynomial determining apparatus in accordance with the invention comprises a polynomial divider and a control unit coupled thereto. The polynomial divider performs Euclid's Algorithm by iteratively solving both equations thereof through performing iterations of polynomial division so as to produce an error locator polynomial from an error syndrome polynomial supplied to the polynomial divider. The control unit determines whether the error locator polynomial has been produced by an iteration of polynomial division, and if the error locator polynomial has not been produced, it causes the polynomial divider to perform another iteration of polynomial division so as to solve both equations of Euclid's Algorithm for another iteration.

More particularly, an error locator polynomial determining apparatus in accordance with the invention can comprise the polynomial divider described above; and a control unit for making a determination based on the quotient polynomial as to whether a further polynomial division is necessary, and if the further polynomial division is necessary, for causing the further polynomial division to occur. Alternatively, the error locator polynomial determining apparatus can comprise:

(a) a polynomial divider which receives an error syndrome polynomial and produces an error locator polynomial therefrom by iteratively performing polynomial division of a numerator polynomial by a denominator polynomial to produce a quotient polynomial and a remainder polynomial, the remainder polynomial produced by each polynomial division being the denominator polynomial of each subsequent polynomial division and the denominator polynomial of each polynomial division being the numerator polynomial of each subsequent polynomial division; and (b) a control unit, coupled to the polynomial divider, for determining whether the quotient polynomial is the error locator polynomial, and if the quotient polynomial is not the error locator polynomial, causing the polynomial divider to perform another polynomial division.

A further apparatus in accordance with the invention which includes a polynomial divider in accordance with the invention is an error correction apparatus which receives a coded signal having errors therein and an error syndrome polynomial produced for the coded signal, and produces a corrected signal therefrom. An error correction apparatus in accordance with the invention comprises:

(a) the error locator polynomial determining apparatus of the alternative embodiment described above;

(b) an error information determiner for determining from the error locator polynomial information pertaining to where within the coded signal the errors are and what the errors are; and (c) a data corrector for receiving the information and the coded signal and producing the corrected signal.

BRIEF DESCRIPTION OF THE DRAWINGS

The invention will now be described in greater detail with reference to the following illustrative drawings, in which.

(Like elements are shown with the same reference numbers or letters.)

DESCRIPTION OF THE PREFERRED EMBODIMENTS

Figure 1:
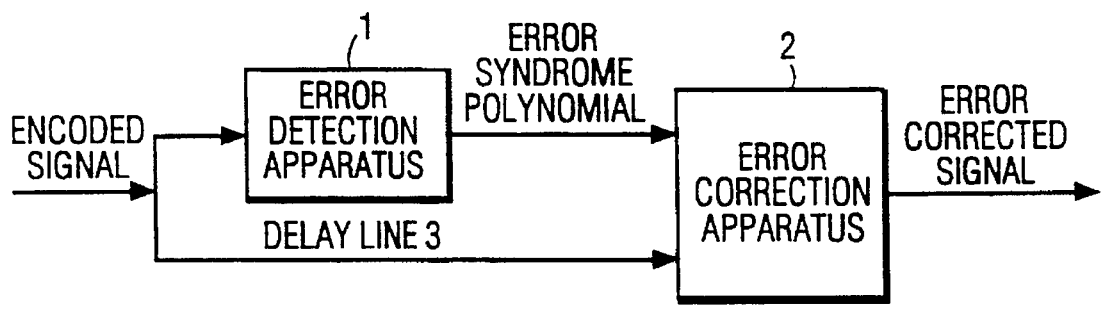
FIG. 1 is a portion of a prior art decoding unit.

FIG. 1 shows a portion of a prior art decoding unit in the situation in which one or more errors exists in one or more data bytes of an encoded signal which is being decoded by the decoding unit. The portion of the decoding apparatus shown in FIG. 1 includes an error detection apparatus 1 coupled to an error correction apparatus 2.

The error detection apparatus 1 and the error correction apparatus 2 of FIG. 1 both receive the encoded signal. Since the error correction apparatus 2 cannot perform error correction on the encoded signal until after the error detection apparatus 1 has completed performing error detection, the decoding unit shown in FIG. 1 includes a delay line 3 which causes the encoded signal to arrive at the error correction apparatus 2 once the error detection apparatus 1 has finished performing error detection. Alternatively, the delay line 3 could be replaced by a temporary memory for temporarily storing the encoded signal until the error detection apparatus 1 has completed performing error detection, or the error correction apparatus 2 could include a temporary memory for temporarily storing the encoded signal until error correction can be performed.

The error detection apparatus 1 of FIG. 1 produces an error syndrome polynomial for the encoded signal in a manner well known to those skilled in the art, and provides the error syndrome polynomial to the error correction apparatus 2. The error correction apparatus 2 uses the error syndrome polynomial to produce an error locator polynomial. The error correction apparatus then uses the error locator polynomial to produce i & e information. Finally, the error correction apparatus uses the i & e information to correct the erroneous data bytes included in the encoded signal and produces an error corrected signal.

Figure 2:
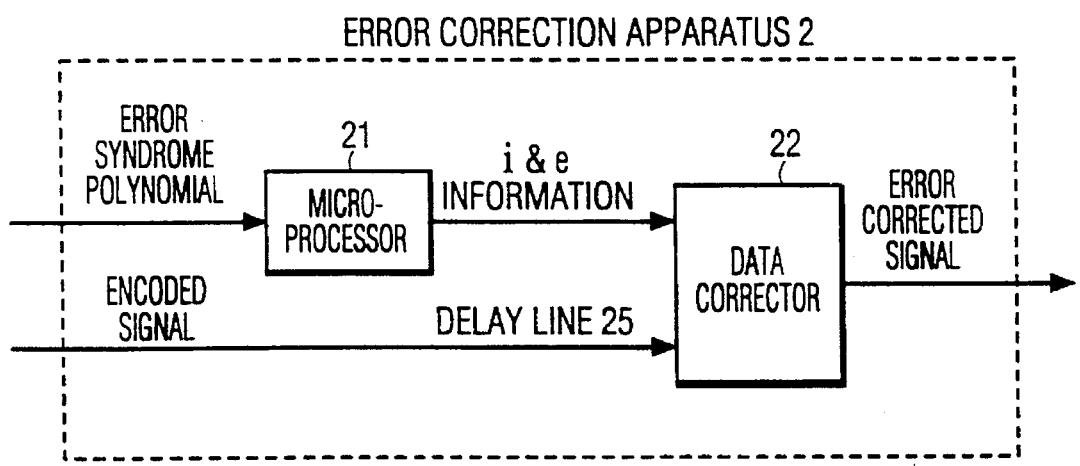
FIGS. 2 and 3 are portions of prior art error correction apparatus.

FIG. 2 shows a prior art embodiment of the error correction apparatus 2 for producing an error corrected signal from an encoded signal having one or more errors in one or more of the data bytes thereof. That embodiment includes a microprocessor 21 and a data corrector 22.

The microprocessor 21 of FIG. 2 produces both the error locator polynomial and the i & e information through use of a computer program. That computer program is designed to enable the microprocessor 21 to perform Euclid's Algorithm to produce the error locator polynomial from the error syndrome polynomial, and to perform the Chien search method to produce the i & e information from the error locator polynomial.

The data corrector 22 of FIG. 2 uses the i & e information and corrects the erroneous data bytes of the encoded signal to produce the error corrected signal. The data corrector 22 of FIG. 2 is made up of a memory unit and a microprocessor (not shown). (The microprocessor of the data corrector 22 and the microprocessor 21 are typically the same microprocessor which performs the functions of both.) The memory of the data corrector 22 is capable of storing the data bytes of the encoded signal in addressable locations which allows the microprocessor of the data corrector 22 to easily access certain of those data bytes on the basis of their address locations. On the basis of the i & e information, the microprocessor of the data corrector 22 accesses the erroneous data bytes included in the memory of the data corrector 22 (on the basis of their address locations) and corrects them, leaving corrected data bytes in the memory of the data corrector 22. Thereafter, the data bytes included in the memory of the data corrector 22 can be read out therefrom producing the error corrected signal.

Since the data bytes of the encoded signal are not error corrected until the i & e information has been produced, those data bytes are provided to the data corrector 22 via means of a delay line 25 so that they arrive at the data corrector 22 as the same time as the i & e information arrives at the data corrector 22. Alternatively, the data bytes of the encoded signal could be stored in a temporary memory (not shown) until they are needed. That temporary memory could either be in place of the delay line 25 or included in the data corrector 22.

The problem with using a microprocessor for determining the error locator polynomial and the i & e information is that it takes too long for current needs. As a result, an error correction apparatus employing use of such a microprocessor is unable to operate as fast as needed.

Figure 3:
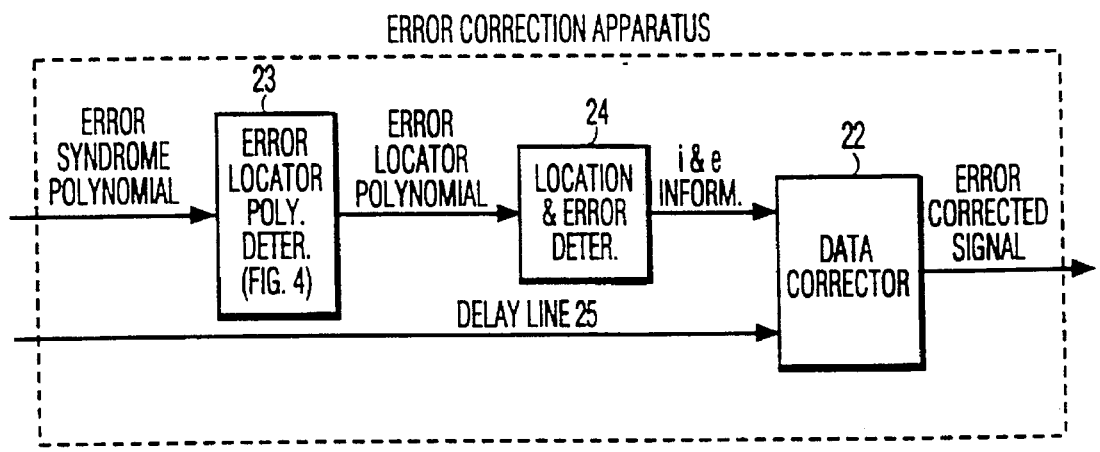

One proposed solution has been to replace the microprocessor 21 of FIG. 2 with an error locator polynomial determiner 23 and a location and error determiner 24 in the manner shown in the error correction apparatus of FIG. 3. The error locator polynomial determiner 23 of FIG. 2 is shown in more detail in FIG. 4.

Figure 4:
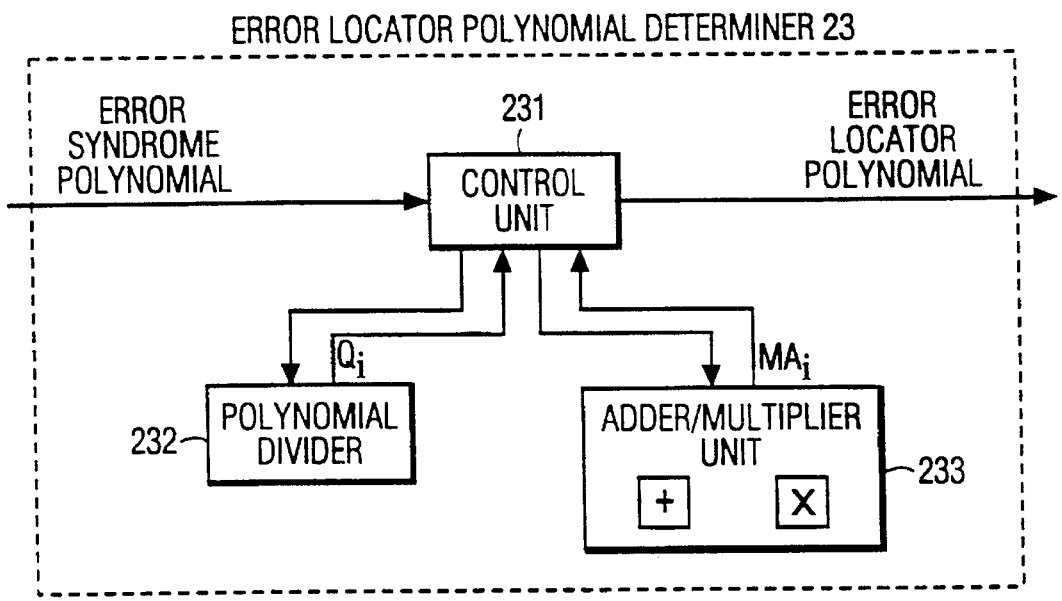
FIG. 4 is an error locator polynomial determiner.

The error locator polynomial determiner 23 of FIG. 4 includes a polynomial divider 232, which provides a (polynomial) quotient as its output; an adder/multiplier unit 233; and a control unit 231. The polynomial divider 232 solves EQ. 1 (identified above) of Euclid's Algorithm and provides polynomial $Q_i$ as its output. The adder/multiplier unit 233 solves EQ. 2 (identified above) of Euclid's Algorithm and provides polynomial $MA_i$ as its output. The control unit 231 operates to produce the error locator polynomial from the error syndrome polynomial by means of controlling the polynomial divider 232 and the adder/multiplier unit 233 so that they iteratively solve both equations, i.e., EQs. 1 and 2 (identified above), of Euclid's Algorithm.

Figure 5:
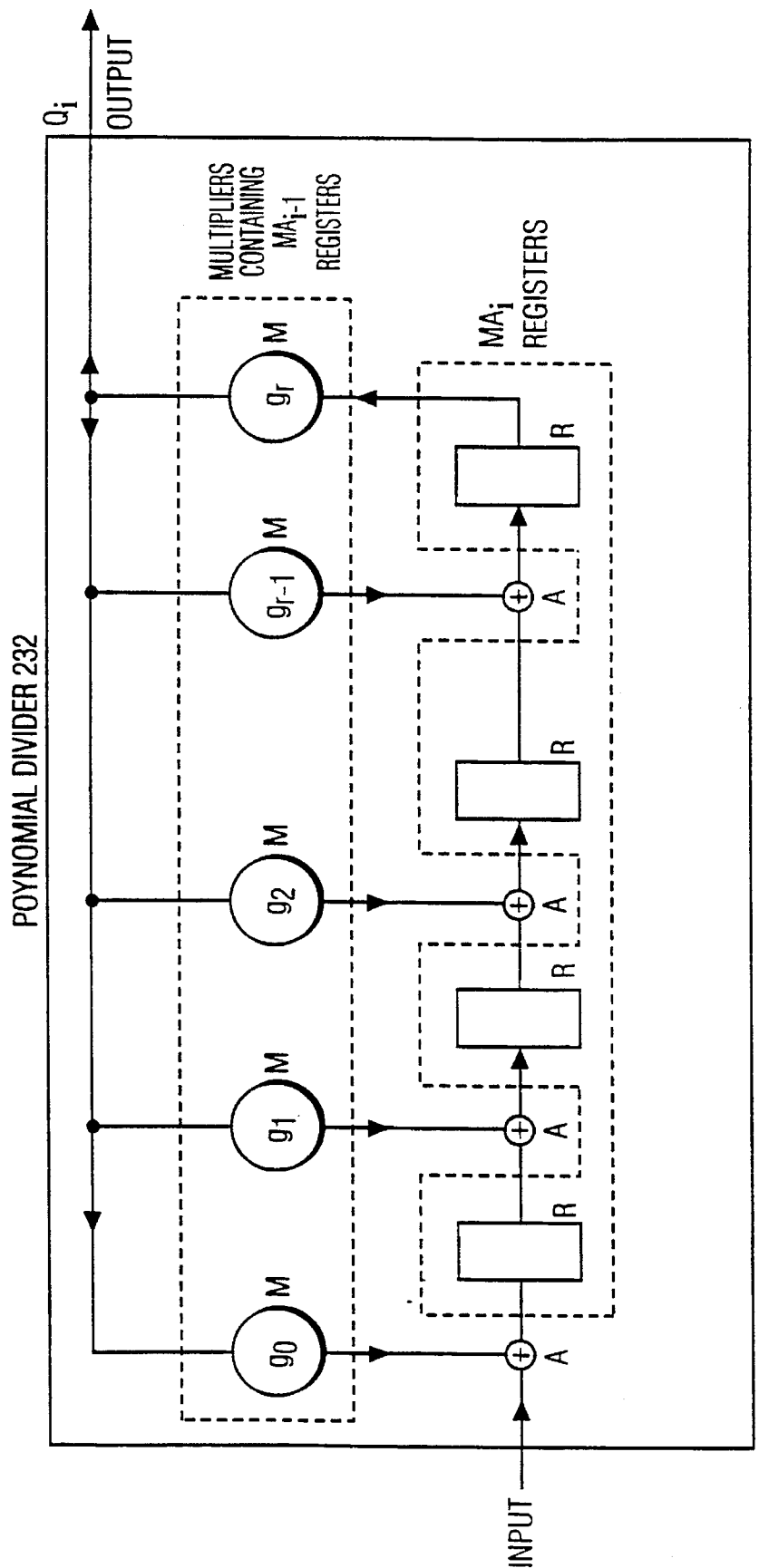
FIG. 5 is a prior art polynomial divider.

An example of the polynomial divider 232 of FIG. 4 is shown in FIG. 5. The polynomial divider 232 of FIG. 5 comprises multipliers M, which each includes a register r (not shown) therein for storing a coefficient which that multiplier M will multiply by; registers R; and adders A. The multipliers M, registers R and adders A are coupled to one another in the manner shown in FIG. 5.

The number of multipliers M, registers R and adders A included in the polynomial divider 232 of FIG. 5 is a function of the number of errors which can be error corrected, i.e., they are a function of T. More specifically, the polynomial divider 232 will include 2T multipliers M, 2T-1 registers R and 2T-1 adders A.

To produce the polynomial $Q_i$, the coefficients of the polynomial which is to act as the denominator, i.e., the coefficients of the polynomial $MA_{i-1}$, are stored in the registers r included in the multipliers M of the polynomial divider 232 of FIG. 5. (Accordingly, those registers are hereinafter referred to as the "$MA_{i-1}$ registers"). One coefficient is stored in each register r. (The highest order coefficient is stored in the right most multiplier M, and the coefficients of decreasing order are stored, in decreasing order, in the successive multipliers M to the left.) The coefficients of the polynomial which is to act as the numerator, i.e., the coefficients of the polynomial $MA_{i-2}$, are applied, one after the other, to the input of the polynomial divider 232, and shifted there-through, producing the polynomial $Q_i$ at the output of the polynomial divider 232.

The polynomial divider 232 of FIG. 5 is well known to persons skilled in the art, and it is discussed, for example, in Peterson and Weldon, *Error-Correcting Codes*, chapter 7, pgs. 170–179, 1980 (4th ed., MIT), which chapter is incorporated herein by reference. Accordingly, a more detailed discussion pertaining to such a polynomial divider and the manner in which it operates is deemed unnecessary.

The adder/multiplier unit 233 of FIG. 4 is a unit which includes a polynomial adder and a polynomial multiplier (such multipliers are also discussed in chapter 7 of the Peterson & Weldon book) coupled together in a manner known to those skilled in the art to enable it to solve EQ. 2 of Euclid's Algorithm.

The control unit 231 of FIG. 4 receives the error syndrome polynomial, i.e., the polynomial $MA_1$, and stores or receives the polynomial $MA_0$ (which is $X^{2T}$). Thereafter, the control unit 231 supplies those polynomials and other polynomials (produced by the polynomial divider 232 and the adder/multiplier unit 233, and received by the control unit 231, in accordance with performing Euclid's Algorithm) to the polynomial divider 232 and the adder/multiplier unit 233 in an iterative manner so as to perform Euclid's Algorithm, i.e., to produce the first polynomial $Q_i$ which has a degree less than T. The control unit 231 is able to determine if the degree of the polynomial $Q_i$ is less than T, and thereby is able to determine the error locator polynomial, i.e., the polynomial $Q_n$. Once the error locator polynomial has been produced, the control unit 231 supplies it to the location and error determiner 24.

The location and error determiner 24 uses the error locator polynomial to produce the i & e information. The location and error determiner 24 of FIG. 3 is of a type which is capable of performing the Chien search method. The location and error detector 24 could be, for example, an apparatus like the one discussed and shown in FIG. 5—5 of chapter 5.3.2 of the Clark and Cain book at pgs. 191–194, which chapter is incorporated herein by reference.

Although the polynomial divider 232 of FIG. 5 (described above) is normally used only to provide the quotient of a division, i.e., the polynomial $Q_i$, as its output, it produces the remainder of the division as well. The remainder is found in the registers R of the polynomial divider 232.

If the results of a division are expressed as follows:

$$n/d = q + r/d, \qquad (EQ. 3)$$

where n is the numerator, d is the denominator, q is the quotient and r is the remainder, the remainder can be expressed as follows, via simple algebra:

$$r = n - qd. \qquad (EQ. 4)$$

Since the polynomial dividers which are used with error correction apparatus perform computations in the binary field, and there is no real difference between addition and substraction in the binary field, EQ. 4 can be expressed as follows, in the binary field:

$$r = n + qd. \qquad (EQ. 5)$$

Accordingly, the polynomial divider 232 of FIG. 5 provides the results of EQ. 5 in its registers R (when used in the binary field).

If one were to substitute $MA_{i-2}$ for n, $MA_{i-1}$ for d and $Q_i$ for q in accordance with the variable of EQ. 1, EQ. 5 would look as follows:

$$r = MA_{i-2} + Q_i MA_{i-1}, \qquad (EQ. 6)$$

By comparing EQ. 6 with EQ. 2, is can be seen that:

$$r = MA_i. \qquad (EQ. 7)$$

Hence, the registers R of the polynomial divider 232, upon completing its production of the polynomial $Q_i$ will contain the coefficients of the polynomial $MA_i$. (Accordingly, those registers are hereinafter referred to as the "$MA_i$ registers"). More specifically, one coefficient is stored in each register R. (The highest order coefficient is stored in the right most register R, and the coefficients of decreasing order are stored, in decreasing order, in the successive registers R to the left.)

From EQs. 1, 2 and 5–7, it has been learned that a single polynomial divider can be used to solve both equations, i.e., EQs. 1 and 2, of Euclid's Algorithm. As a result, use of a separate adder/multiplier unit to solve EQ. 2 of Euclid's Algorithm is not needed, and a polynomial divider can be used to perform Euclid's Algorithm to produce an error locator polynomial from an error syndrome polynomial.

Figure 6:
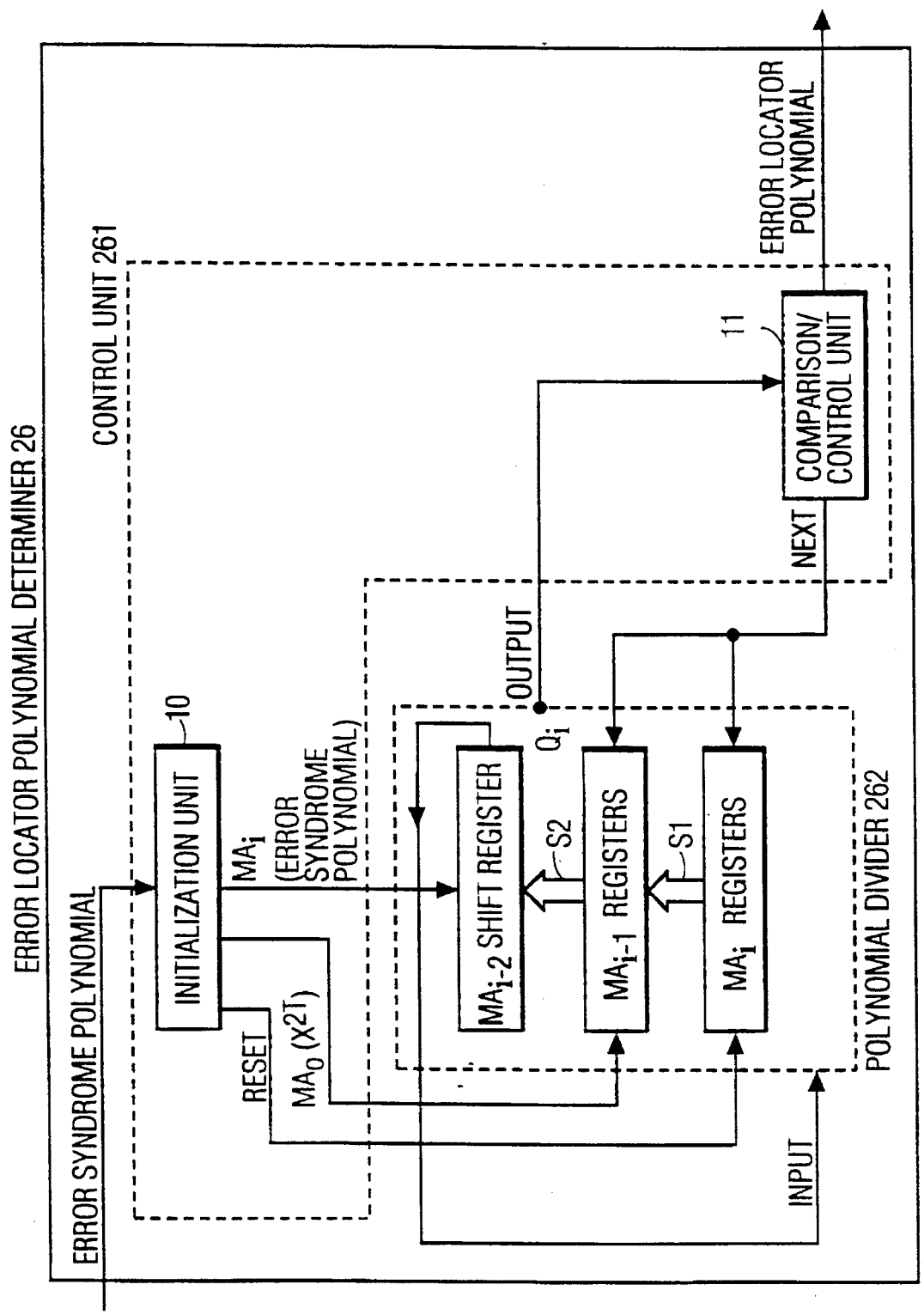
FIG. 6 is an error locator polynomial determiner in accordance with the invention.

FIG. 6 shows an error locator polynomial determiner 26 in accordance with the invention. Like the error locator polynomial determiner 23 of FIG. 4, the error locator polynomial determiner 26 of FIG. 6 includes a control unit 261 and a polynomial divider 262. It does not, however, include an adder/multiplier unit for solving EQ. 2 of Euclid's Algorithm.

Figure 7:
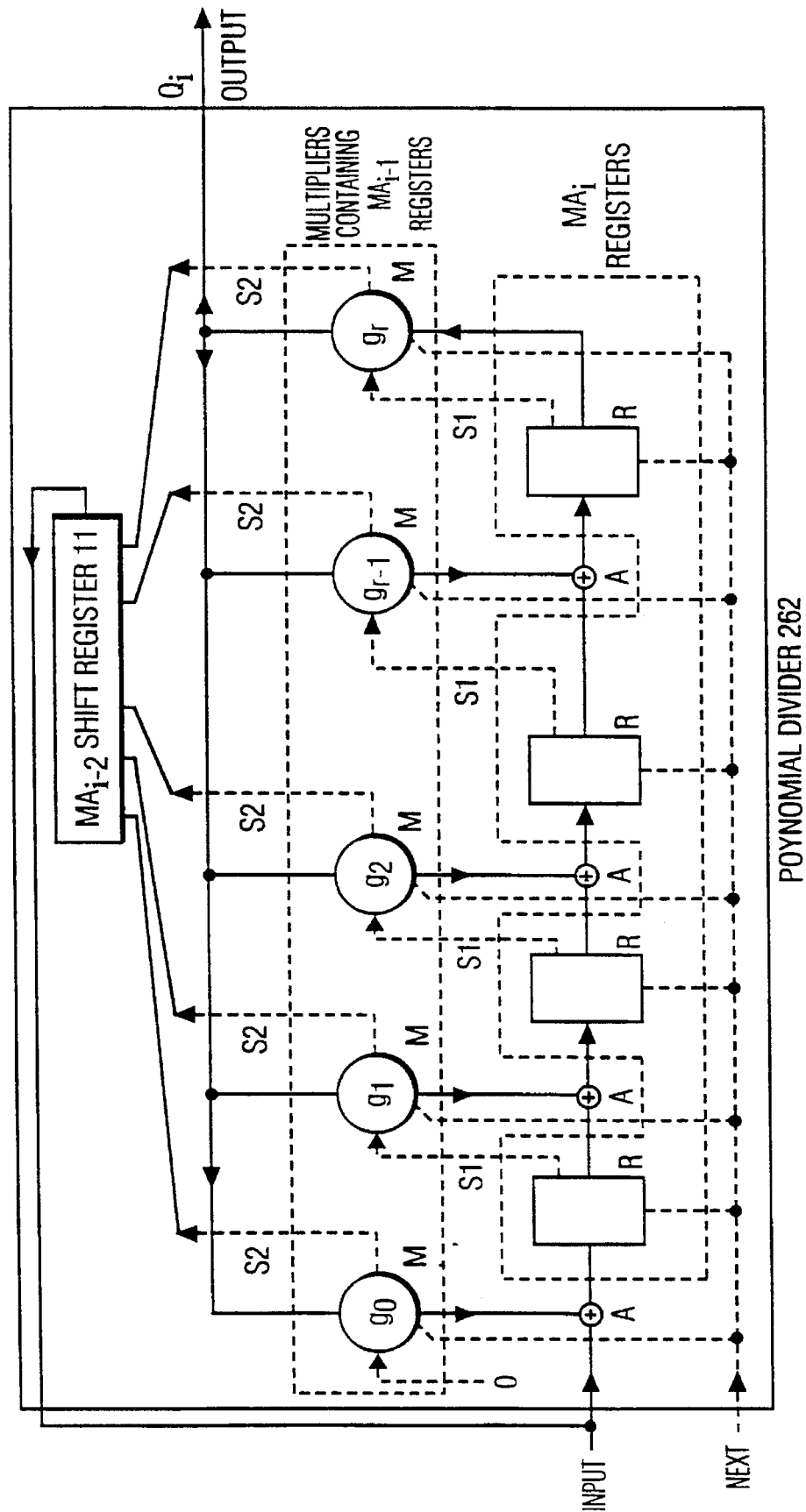
FIG. 7 is a polynomial divider in accordance with the invention.

FIG. 7 shows the polynomial divider 262 in more detail. (FIG. 6 only shows certain aspects of the polynomial divider 262). Before discussing the polynomial divider 262 in detail, it is helpful to understand the factors which lead to its design.

From the discussion provided above, it should be clear that in performing Euclid's Algorithm to produce the error locator polynomial, only EQ. 1, i.e., the equation which determines the polynomial $Q_i$ is of true importance, for a certain polynomial $Q_i$ is the error locator polynomial (i.e., the polynomial $Q_n$). The only function which EQ. 2, i.e., the equation which determines the polynomial $MA_i$, actually performs is to enable the next polynomial $Q_{i+1}$ to be determined. Accordingly, the only output which must be provided by a polynomial divider in accordance with the invention (i.e., one which is capable of solving both equations of Euclid's Algorithm) is one which provides the polynomial $Q_i$ for each iteration.

In addition, from the discussion which has been provided above, it should be clear that the remainder polynomial produced by the polynomial divider 232 of FIG. 5 when it produces the (quotient) polynomial $Q_i$, i.e., the polynomial $MA_i$, should be used as the denominator polynomial for producing the next (quotient) polynomial $Q_{i+1}$; and the denominator polynomial which is used to produce the (quotient) polynomial $Q_i$, i.e., the polynomial $MA_{i-1}$ should be used as the numerator polynomial for producing the next (quotient) polynomial $Q_{1+1}$. Accordingly, to produce the next (quotient) polynomial $Q_{i+1}$, the coefficients of the polynomial included in the registers R of the polynomial divider 232, i.e., the coefficients of the polynomial $MA_i$, should become the coefficients of the polynomial included in the registers r (included in the multipliers M), and the coefficients of the polynomial included in the registers r, i.e., the coefficients of the polynomial $MA_{i-1}$, should become the coefficients of the polynomial input to the polynomial divider 232. The polynomial divider 262 of FIG. 7 is designed to do just that.

The polynomial divider 262 of FIG. 7 is a modified version of the polynomial divider 232 of FIG. 5 which enables it to iteratively solve both equations (i.e., EQs. 1 and 2) of Euclid's Algorithm, i.e., to perform Euclid's Algorithm, to ultimately produce the error locator polynomial from the error syndrome polynomial. The main distinction between the polynomial divider 262 of FIG. 7 and the polynomial divider 232 of FIG. 5 is that the polynomial divider 262 of FIG. 7 includes additional connections (i.e., coupling units) which allow and cause the polynomial stored in the $MA_i$ registers, i.e., the polynomial $MA_i$, to become the new polynomial stored in the $MA_{i+1}$ registers (i.e., the new denominator polynomial), and the polynomial stored in the $MA_{i+1}$ registers, i.e., the polynomial $MA_{i-1}$, to be used as the new polynomial applied to the input of the polynomial divider 262 (i.e., the new numerator polynomial) for producing the next (quotient) polynomial $Q_{i+1}$, upon completion of production of the (quotient) polynomial $Q_i$.

To enable what has just been stated to occur each of the registers R and r (the latter being included in the multipliers M) of the polynomial divider 262 of FIG. 7 has an input for receiving a next iteration control signal which indicates that another iteration of Euclid's Algorithm is to be performed. When the $MA_i$ registers receive the next iteration control signal, each of the $MA_i$ registers shifts the coefficient stored therein to a corresponding one of the $MA_{i-1}$ registers via line a S1. When the $MA_{i-1}$ registers receive the next iteration control signal, they shift the coefficients stored therein out of the polynomial divider 262 via lines S2 into to an $MA_{i-2}$ shift register which enables those coefficients to be provided to the input of the polynomial divider 262 as an input polynomial. The $MA_{i-2}$ shift register is designed to store the coefficients of a polynomial and then shift those coefficient into the input of the polynomial divider 262 in a manner in which the highest order coefficient is read into the polynomial divider 262 first and the coefficients of decreasing order follow thereafter so that the polynomial divider 262 can determine the polynomials $Q_i$ and $MA_i$ therefrom for an iteration of Euclid's Algorithm.

It should be noted that although the $MA_{i-2}$ shift register is shown as being a part of the of the polynomial divider 262, it can be a part of the control unit 261, or it can be separate from both of them. In addition, it should be noted that because there is one less register r then there is register R in the polynomial divider 262, once the polynomial $Q_i$ for the first iteration of Euclid's Algorithm has been produced, upon receipt of the next iteration control signal for the first time, the contents of the register r included in the multiplier M designated $g_o$ is set to zero.

The control unit 261 of FIG. 6 includes an initialization unit 10 and a comparison/control unit 11. The initialization unit 10 is designed to initialize the polynomial divider 262 prior to the error locator polynomial determiner 26 beginning its performance of Euclid's Algorithm. The comparison/control unit 11 operates to compare the degree of the $Q_i$ polynomial produced by the polynomial divider 262 for an iteration of Euclid's Algorithm to see whether it is less than T, and, depending upon that outcome, to output either that $Q_i$ polynomial as the error locator polynomial or the next iteration control signal.

Upon receipt of an error syndrome polynomial (from the error detection apparatus 1, for example), the initialization unit 10 initializes the polynomial divider 262 by resetting the $MA_i$ registers to zero; storing the polynomial $MA_0$, which is $X^{2T}$, in the $MA_{i-1}$ registers; and storing the $MA_1$ polynomial, i.e., the error syndrome polynomial, in the $MA_{i-2}$ shift register. In a preferred embodiment T is equal to 8, meaning that eight errors can be corrected.

Once the polynomial divider 262 has been initialized, the error locator polynomial determiner 26 is ready to perform the first iteration of Euclid's Algorithm (i.e., i=2). In accordance with its design, once the error syndrome polynomial has been stored in the $MA_{i-2}$ shift register, the coefficients of that polynomial are shifted into the input of the polynomial divider 262 in a manner in which the highest order coefficient is read into the polynomial divider 262 first and the coefficients of decreasing order follow thereafter.

The polynomial divider 262 shifts the error syndrome polynomial there-through and produces the polynomials $Q_2$ and $MA_2$ for the first iteration of Euclid's Algorithm (i.e., i=2). The polynomial $Q_2$ is provided at the output of the polynomial divider 262, and the polynomial $MA_2$ is stored in the $MA_i$ registers.

The $Q_2$ polynomial is then provided to the comparison/control unit 11, which determines whether the degree of the polynomial $Q_2$ is less than T. If it is, the comparison/control unit 11 outputs the polynomial $Q_2$ as the error locator polynomial. If the degree of the polynomial $Q_2$ is greater than or equal to T, the comparison/control unit does not output the polynomial $Q_2$ as the error locator polynomial, but rather outputs, via a different output, the next iteration control signal to the polynomial divider 262 so that the polynomials $Q_i$ and $MA_i$ for the next, i.e., another, iteration of Euclid's Algorithm are produced (i.e., i>2).

Both the $MA_i$ and $MA_{i-1}$ registers are designed to receive the next iteration control signal. When the next iteration control signal is received by the polynomial divider 262, simultaneously (a) the $MA_i$ registers (i) shift the coefficients of the polynomial stored therein to corresponding registers of the $MA_{i-1}$ registers and (ii) are reset to zero, and (b) the $MA_{i-1}$ registers shift the coefficients of the polynomial stored therein to the $MA_{i-2}$ shift register.

Once the $MA_{i-2}$ shift register receives and stores the coefficients of the polynomial that were stored in the $MA_{i-1}$ registers, it shifts those coefficients into the input of the polynomial divider 262, and the polynomial divider 262 produces the polynomials $Q_i$ and $MA_i$ for the next iteration of Euclid's Algorithm (i.e., i>2). That polynomial $Q_i$ is provided to the comparison/control unit 11, and it determines whether the degree of that polynomial $Q_i$ is less than T. If it is, the comparison/control unit 11 outputs that polynomial $Q_i$ as the error locator polynomial. If it is not, the comparison/control unit 11 again outputs the next iteration control signal to the polynomial divider 262, and the process of producing the polynomials $Q_i$ and $MA_i$ for another iteration of Euclid's Algorithm occurs again. That process is continued until a polynomial $Q_i$ is produced which has a degree which is less than T, and that polynomial $Q_i$ is output as the error locator polynomial.

It is noted that the comparison/control unit 11 can be designed in a number of ways. Nevertheless, in the preferred embodiment, it includes (a) a temporary memory, such as a shift register, for storing the polynomial $Q_i$ whose degree is being compared to T; (b) a comparator for comparing the degree of the polynomial $Q_i$ to T; and (c) a signal generator for producing the next iteration control signal when the degree of the polynomial $Q_i$ is greater than or equal to T.

In addition to eliminating unnecessary hardware, the error locator polynomial determiner 26 of FIG. 6 also saves on processing time. In the error locator polynomial determiner 23 of FIG. 4, it was necessary to solve EQ. 1 of Euclid's Algorithm before EQ. 2 of Euclid's Algorithm because EQ. 2 of Euclid's Algorithm requires that the polynomial $Q_i$ be produced before the polynomial $MA_i$ can be produced. The result of this is that only one of the equations of Euclid's Algorithm could be solved at a time. The error locator polynomial determiner 26 of FIG. 6 does not suffer from that problem because both equations of Euclid's Algorithm are solved simultaneously by the polynomial divider 262 of FIG. 7. Accordingly, the error locator polynomial determiner 26 of FIG. 6 operates in a more efficient manner, i.e., with less equipment and in less time, than the error locator polynomial determiner 23 of FIG. 4.

Finally, it should be noted that an error correction apparatus in accordance with the invention is of the type shown in FIG. 3 employing the error locator polynomial determiner 26 of FIG. 6 in place of the error locator polynomial determiner 23 of FIG. 4. Such an error correction apparatus is capable of performing the error correction process in a faster and cheaper manner than in the prior art.

I claim:

1. A polynomial divider, comprising:

polynomial division means for performing polynomial division of a numerator polynomial by a denominator polynomial to produce a quotient polynomial and a remainder polynomial, said polynomial division means including:

a first set of registers for storing the denominator polynomial used in a polynomial division; and a second set of registers for storing the remainder polynomial produced by the polynomial division;

an input coupled to said polynomial division means for receiving the numerator polynomial used in the polynomial division;

an output coupled to said polynomial division means for supplying the quotient polynomial produced by the polynomial division;

first coupling means for coupling said first set of registers to said input so that the denominator polynomial stored in said first set of registers becomes the numerator polynomial which is received by said input and used in a further polynomial division performed by said polynomial division means; and second coupling means for coupling said second set of registers to said first set of registers so that the remainder polynomial stored in said second set of registers becomes the denominator polynomial which is stored in said first set of registers and used in the further polynomial division.

2. The polynomial divider as claimed in claim 1, wherein said first coupling means includes a shift register for storing a polynomial and then supplying that polynomial to said input.

3. The polynomial divider as claimed in claim 1, wherein the numerator polynomial and the denominator polynomial of a first polynomial division performed by said polynomial division means are an error syndrome polynomial and a polynomial constant, respectively, and the quotient polynomial of a final polynomial division performed by said polynomial division means is an error locator polynomial.

4. The polynomial divider as claimed in claim 3, wherein the polynomial constant is $X^{2T}$, and T is equal to 8.

5. An error locator polynomial determining apparatus comprising:

the polynomial divider as claimed in claim 1; and control means for (a) making a determination based on the quotient polynomial as to whether a further polynomial division is necessary, and (b) if the further polynomial division is necessary, for causing said further polynomial division to occur, said control means being coupled to the polynomial divider.

6. The error locator polynomial determining apparatus as claimed in claim 5, wherein said control means is adapted to compare the degree of the quotient polynomial produced by the polynomial division to a constant to determine whether the further polynomial division is necessary.

7. The error locator polynomial determining apparatus as claimed in claim 6, wherein the constant is T, and T is 8.

8. The error locator polynomial determining apparatus as claimed in claim 5, wherein said control means is adapted to cause said further polynomial division to occur if the degree of the quotient polynomial produced by the polynomial division is greater than or equal to a constant.

9. The error locator polynomial determining apparatus as claimed in claim 8, wherein the constant is T, and T is 8.

10. The error locator polynomial determining apparatus as claimed in claim 5, wherein when said control means determines that the further polynomial division is necessary, said control means is adapted to:

(a) cause said second set of registers to supply, via said second coupling means, the remainder polynomial stored therein to the first set of registers to be stored therein, thereby becoming the denominator polynomial for the further polynomial division; and (b) cause said first set of registers to supply, via said first coupling means, the denominator polynomial stored therein to be supplied to said input, thereby becoming the numerator polynomial for the further polynomial division and causing said polynomial determining means to perform the further polynomial division.

11. An error locator polynomial determining apparatus, a polynomial divider which receives an error syndrome polynomial and produces an error locator polynomial therefrom by iteratively performing polynomial division of a numerator polynomial by a denominator polynomial to produce a quotient polynomial and a remainder polynomial, the remainder polynomial produced by each polynomial division being the denominator polynomial of each subsequent polynomial division and the denominator polynomial of each polynomial division being the numerator polynomial of each subsequent polynomial division; and control means, coupled to said polynomial divider, for (a) determining whether the quotient polynomial is the error locator polynomial, and (b) if the quotient polynomial is not the error locator polynomial, causing said polynomial divider to perform another polynomial division.

12. The error locator polynomial determining apparatus as claimed in claim 11, wherein said control means is adapted to compare the degree of the quotient polynomial to a constant to determine if the quotient polynomial is the error locator polynomial.

13. The error locator polynomial determining apparatus as claimed in claim 12, wherein the constant is T, and T is equal to 8.

14. The error locator polynomial determining apparatus as claimed in claim 11, wherein said control means is adapted to cause said polynomial divider to perform another polynomial division if the degree of the quotient polynomial is greater than or equal to a constant.

15. The error locator polynomial determining apparatus as claimed in claim 14, wherein the constant is T, and T is equal to 8.

16. The error locator polynomial determining apparatus as claimed in claim 11, where the numerator polynomial and the denominator polynomial of a first iteration of polynomial division are the error syndrome polynomial and a polynomial constant, respectively.

17. The error locator polynomial determining apparatus as claimed in claim 16, wherein the polynomial constant is $X^{2T}$, and T is equal to 8.

18. The error locator polynomial determining apparatus as claimed in claim 11, wherein the quotient polynomial and the remainder polynomial produced by each iteration of polynomial division represent the solutions of an iteration of both equations of Euclid's Algorithm.

19. An error correction apparatus for receiving a coded signal having errors therein and an error syndrome polynomial produced for the coded signal, and producing a corrected signal therefrom, the error correction apparatus comprising:

the apparatus as claimed in claim 11;

means for determining, from the error locator polynomial, information pertaining to where within the coded signal the errors are and what the errors are; and error correcting means for receiving the information and the coded signal and producing the corrected signal.

20. The error correction apparatus as claimed in claim 19, wherein said control means is adapted to cause said polynomial divider to perform another polynomial division if the degree of the quotient polynomial is greater than or equal to a constant T, where T is equal to 8 and represents the number of errors which the error correction apparatus can correct.

21. An error locator polynomial determining apparatus, comprising:

a polynomial divider which performs Euclid's Algorithm by iteratively solving both equations thereof through performing iterations of polynomial division so as to produce an error locator polynomial from an error syndrome polynomial supplied to the polynomial divider; and control means, coupled to said polynomial divider, for (a) determining, on the basis of a quotient polynomial produced by the polynomial divider, whether the error locator polynomial has been produced by an iteration of polynomial division, and (b), if the error locator polynomial has not been produced, causing said polynomial divider to perform another iteration of polynomial division so as to solve both equations of Euclid's Algorithm for another iteration of Euclid's Algorithm.

22. An error correction apparatus, comprising the error locator polynomial determining apparatus of claim 21.

* * * * *